United States Patent
Berger (10) Patent No.: US 8,151,223 B2
(45) Date of Patent: Apr. 3, 2012

(54) SOURCE MASK OPTIMIZATION FOR MICROCIRCUIT DESIGN

(75) Inventor: Gabriel Berger, Cupertino, CA (US)

(73) Assignee: Mentor Graphics Corporation, Wilsonville, OR (US)

(*) Notice: Subject to any disclaimer, the term of this patent is extended or adjusted under 35 U.S.C. 154(b) by 114 days.

(21) Appl. No.: 12/503,024

(22) Filed: Jul. 14, 2009

(65) Prior Publication Data

US 2010/0135569 A1 Jun. 3, 2010

Related U.S. Application Data

(60) Provisional application No. 61/080,602, filed on Jul. 14, 2008.

(51) Int. Cl.
*G06F 17/50* (2006.01)

(52) U.S. Cl. .................. 716/54; 716/50; 430/5

(58) Field of Classification Search .......... 716/50, 716/54; 430/5
See application file for complete search history.

(56) References Cited

U.S. PATENT DOCUMENTS

| | | | | |
|---|---|---|---|---|
| 5,982,545 A * | 11/1999 | Su | | 359/569 |
| 6,563,566 B2 * | 5/2003 | Rosenbluth et al. | | 355/67 |
| 6,632,574 B1 * | 10/2003 | Sugita | | 430/5 |
| 7,026,082 B2 * | 4/2006 | Eurlings et al. | | 430/30 |
| 7,233,887 B2 * | 6/2007 | Smith | | 703/2 |
| 7,863,763 B2 * | 1/2011 | Van Haren et al. | | 257/797 |
| 7,944,545 B2 * | 5/2011 | Bagheri et al. | | 355/53 |
| 2004/0137343 A1 * | 7/2004 | Eurlings et al. | | 430/30 |
| 2007/0081158 A1 * | 4/2007 | Brady et al. | | 356/310 |
| 2008/0069445 A1 * | 3/2008 | Weber | | 382/181 |

* cited by examiner

*Primary Examiner* — Naum Levin
(74) *Attorney, Agent, or Firm* — Mentor Graphics Corporation (57) ABSTRACT

A method and apparatus for generating a source illuminator profile and a mask design, subsequently optimizing the source illuminator profile and mask design based upon a set of target intensity profiles. In various implementations, the Lagrange method of optimization is employed to optimize the radiation source, wherein an optimum intensity for each pixel of the source is determined. Subsequently, a continuous tone mask is generated based upon the diffraction orders of the optimized source. With various implementations, the target intensity profile is generated by deriving a set of band limited target frequencies corresponding to the optical lithographic system. Subsequently, homotopy methods may be employed to optimize the source illuminator profile and the continuous tone mask based upon the set of band limited target frequencies.

3 Claims, 11 Drawing Sheets

SOURCE MASK OPTIMIZATION FOR MICROCIRCUIT DESIGN

RELATED PATENT APPLICATIONS

The present application claims priority under 35 U.S.C. §119 to U.S. Provisional Patent Application No. 61/080,602, entitled "Illumination Source-Mask Optimization," filed on Jul. 14, 2008 and naming Gabriel Berger as inventor, which application is incorporated entirely herein by reference.

FIELD OF THE INVENTION

The invention relates to the field of integrated circuit design and manufacturing. More particularly, various implementations of the invention are applicable to optimizing the source and the mask used in a lithographic process.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design is typically described by a Hardware Design Language (HDL), such as the Very high speed integrated circuit Hardware Design Language (VHDL). The logic of the circuit is then analyzed, to confirm that it will accurately perform the functions desired for the circuit.

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices.

Integrated circuit layout descriptions can be provided in many different formats. The Graphic Data System II (GDSII) format is popular for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in integrated circuit layout designs. Once the microcircuit device design is finalized, the layout portion of the design can be used by fabrication tools to manufacturer the device using a lithographic process.

There are many variations of lithography that can be used to manufacture a circuit, but most variations include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured. It is often said that the lithographic process "prints" the features onto the substrate. Additionally, the features or image created on the substrate is often referred to as the "printed image."

As indicated above, lithography causes features to be created on a wafer in part by controlling light or radiation as it hits the wafer. For each step of exposing the wafer to radiation, a mask is used to prevent some areas of the wafer to exposure. Another factor that effects how a pattern or feature is printed is the radiation source. As those of skill in the art understand, the brightness of the radiation source and the pattern of the radiation source as it illuminates the mask effects the printed image. Illumination sources may be formed by hard stop apertures or by programmable sources. Programmable sources are advantageous because they enable complex sources not possible with hard stop apertures. The source shape or pattern formed by the programmable source is often referred to as the source illuminator shape or the source illuminator profile.

As designers and manufacturers continue to increase the number of circuit components in a given area and/or shrink the size of circuit components, the shapes reproduced on the substrate become smaller and are placed closer together. This reduction in feature size increases the difficulty of faithfully reproducing the image intended by the layout design onto the substrate. To account for this, designers have developed various source and mask optimization methods. Some are discussed in *Optimum Mask And Source Patterns To Print A Given Shape*, by Alan E. Rosenbluth et al., JM³ 1(1), April 2002, *Improved Mask And Source Representations For Automatic Optimization Of Lithographic Process Conditions Using A Generic Algorithm*, by T. Fuhner et al., SPIE Vol. 5754, 2004, U.S. Pat. No. 7,245,354, entitled *Source Optimization For Image Fidelity And Throughput*, issued Jul. 17, 2007 to Yuri Ganik, and *Fast Pixel Based Optimization For Inverse Lithography*, by Yuri Granik, JM3 5(4), 2006, which articles are incorporated entirely herein by reference.

The methods discussed above however do not always result in a solvable optimization problem. Additionally, due to the complex nature of the lithographic process, optimization processes that account for both the source illuminator and the mask are extremely time consuming to solve. For example, optimizing a source and a mask for less than 5% of a modern design can take months of computer processing time. This is even true with modern distributed computing techniques.

SUMMARY OF THE INVENTION

Various implementations of the invention provide methods and apparatuses for generating a source illumination profile and a continuous tone mask for utilization in an optical lithographic process. A source illuminator profile is generated based upon an optimization of the optical lithographic radiation source. Various implementations may employ the Lagrange method for optimizing the radiation source, wherein an optimum intensity for each pixel of the source is determined Subsequently, a continuous tone mask is generated based upon an optimization of intensity of radiation projected by the optical lithographic radiation source upon a wafer. In various implementations of the invention, the optimization derives optimum diffraction orders of the radiation, and based upon the optimized diffraction orders determines a transmission value for each pixel of the mask.

With various implementations of the invention, the source illuminator profile and continuous tone mask are optimized based upon a target intensity profile. In various implementations, the target intensity profile is generated by deriving a set of band limited target frequencies corresponding to the optical lithographic system. Subsequently, homotopy methods may be employed to optimize the source illuminator profile and the continuous tone mask based upon the set of band limited target frequencies.

These and additional implementations of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE IMPLEMENTATIONS

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" to describe the disclosed methods. Such terms are high-level abstractions of the actual operations that are performed. The actual operations that correspond to these terms will vary depending on the particular implementation and are readily discernible by one of ordinary skill in the art.

Some of the methods described herein can be implemented by software stored on a computer readable storage medium, or executed on a computer. Additionally, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Optical Lithography

Figure 1:
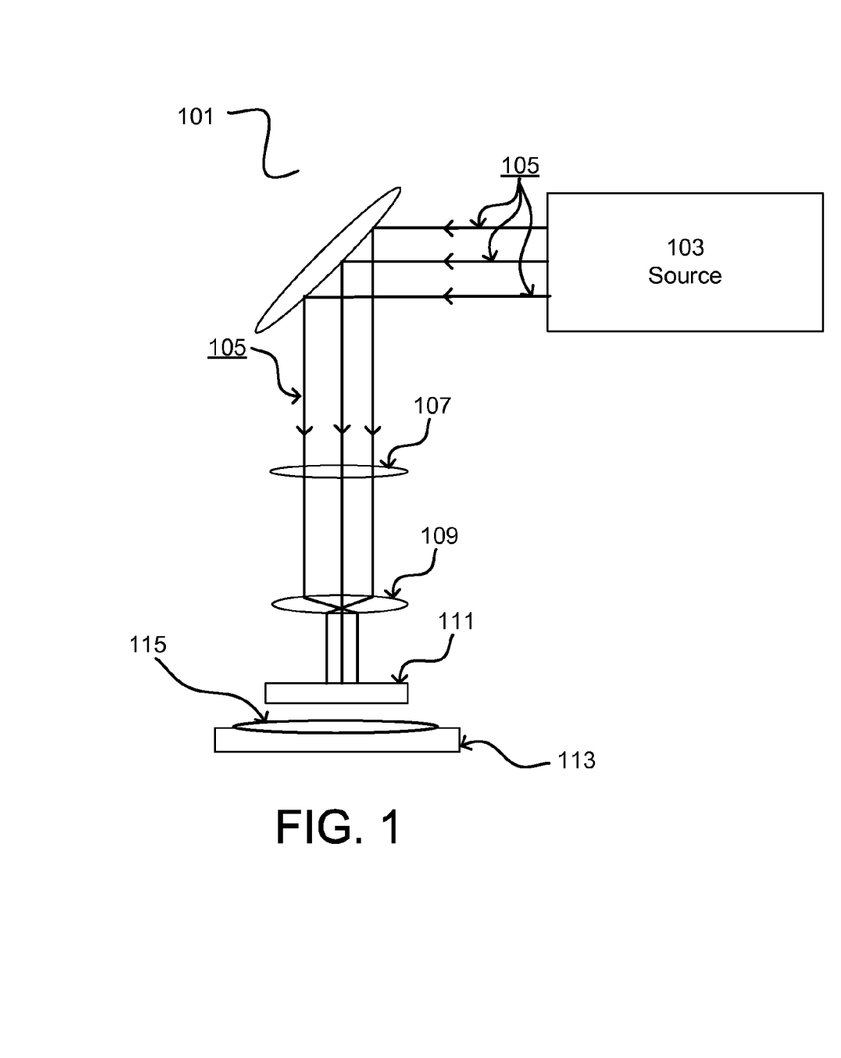
FIG. 1 shows a lithographic process apparatus.
Figure 2A:
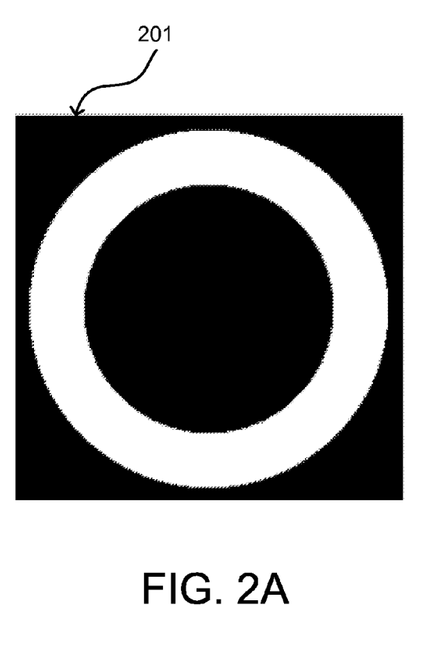
FIG. 2A shows a source illuminator profile for use in a lithographic process.
Figure 2B:
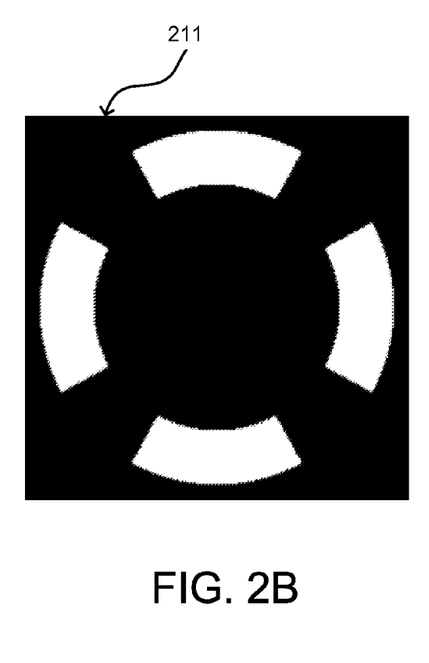
FIG. 2B shows a source illuminator profile for use in a lithographic process.
Figure 2C:
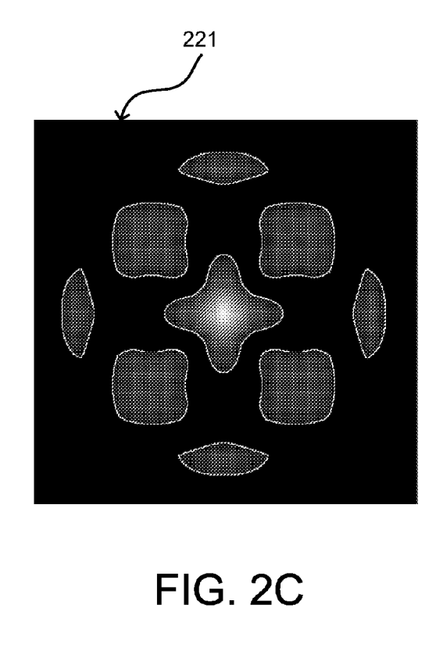
FIG. 2C shows a source illuminator profile for use in a lithographic process.

Before describing the source mask optimization techniques of the present invention, it is useful to provide an overview of optical lithography and particularly, source and mask shapes. This overview is discussed with reference to FIG. 1, FIG. 2, and FIG. 3 below. FIG. 1 illustrates a lithographic process apparatus 101, suitable for use in conjunction with various implementations of the present invention. As can be seen from this Figure, the lithographic process apparatus 101 includes a radiation source 103, which emits radiation 105. Additionally, a source illuminator 107 is shown. As stated above, the source illuminator may have various profiles. Source illuminator profiles were traditionally formed by hard stop apertures, limiting the source profile to simple annular, dipole, and quadrapole shapes. FIG. 2A shows an annular source illuminator profile 201 that may be formed by a hard stop aperture. Additionally, FIG. 2B shows a quadrapole source illuminator profile 211 that may be formed by a hard stop aperture. Both profiles 201 and 211 may be employed in a lithographic process to control the brightness and shape of the radiation 105. However, as further stated above, programmable sources may be employed to generate complex source shapes. FIG. 2C shows a complex source illuminator profile 221. The source illuminator profile 221 may be formed by a programmable source. A common programmable source employed in lithographic processes is a diffractive optical element (DOE). Diffractive optical elements work similar to a hologram to produce the desired light pattern from an incoming light source such as a laser.

Figure 3:
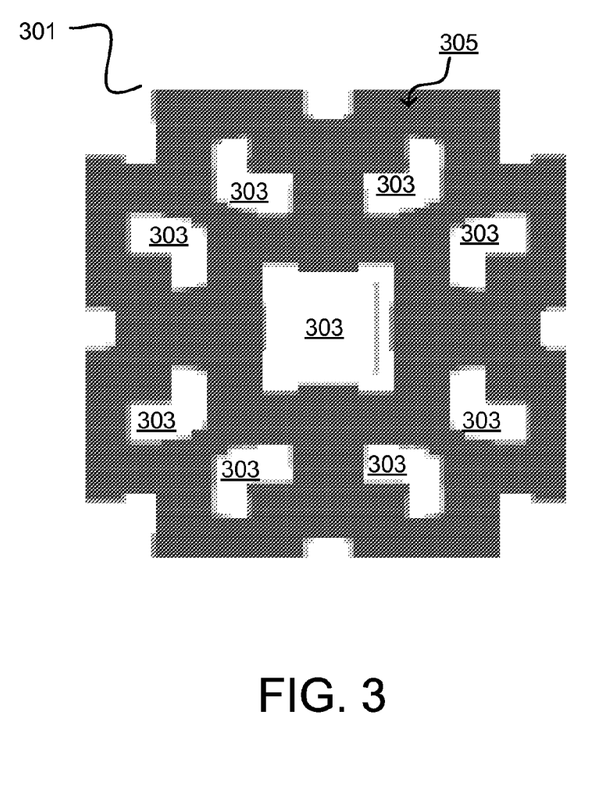
FIG. 3 shows a mask for use in a lithographic process.

Returning to FIG. 1, the lithographic process apparatus 101 includes a lens 109 for controlling the uniformity of the radiation 105, a mask 111 and an alignment table 113 holding a substrate 115. The alignment table 113 is used to position the substrate 115 with respect to the radiation 105 and the mask 111. The mask 111, as described above, is used to prevent radiation from contacting specific areas of the substrate. FIG. 3 shows a mask 301. As can be seen from this figure, the mask 301 has areas 303 that permit radiation to pass through the mask and areas 305 that prevent radiation from passing through the mask. As those of skill in the art can appreciate, there are other possible aspects to the lithographic process. However, details well known to those of skill in the art have been omitted.

Illustrative Computing Environment

As the techniques of the present invention may be implemented using software instructions, the components and operation of a generic programmable computer system on which various implementations of the invention may be employed is described. Further, because of the complexity of some electronic design automation processes and the large size of many circuit designs, various electronic design automation tools are configured to operate on a computing system capable of simultaneously running multiple processing threads. The components and operation of a computer network 401 having a host or master computer and one or more remote or slave computers therefore will be described with reference to FIG. 4. This operating environment is only one example of a suitable operating environment, however, and is not intended to suggest any limitation as to the scope of use or functionality of the invention.

Figure 4:
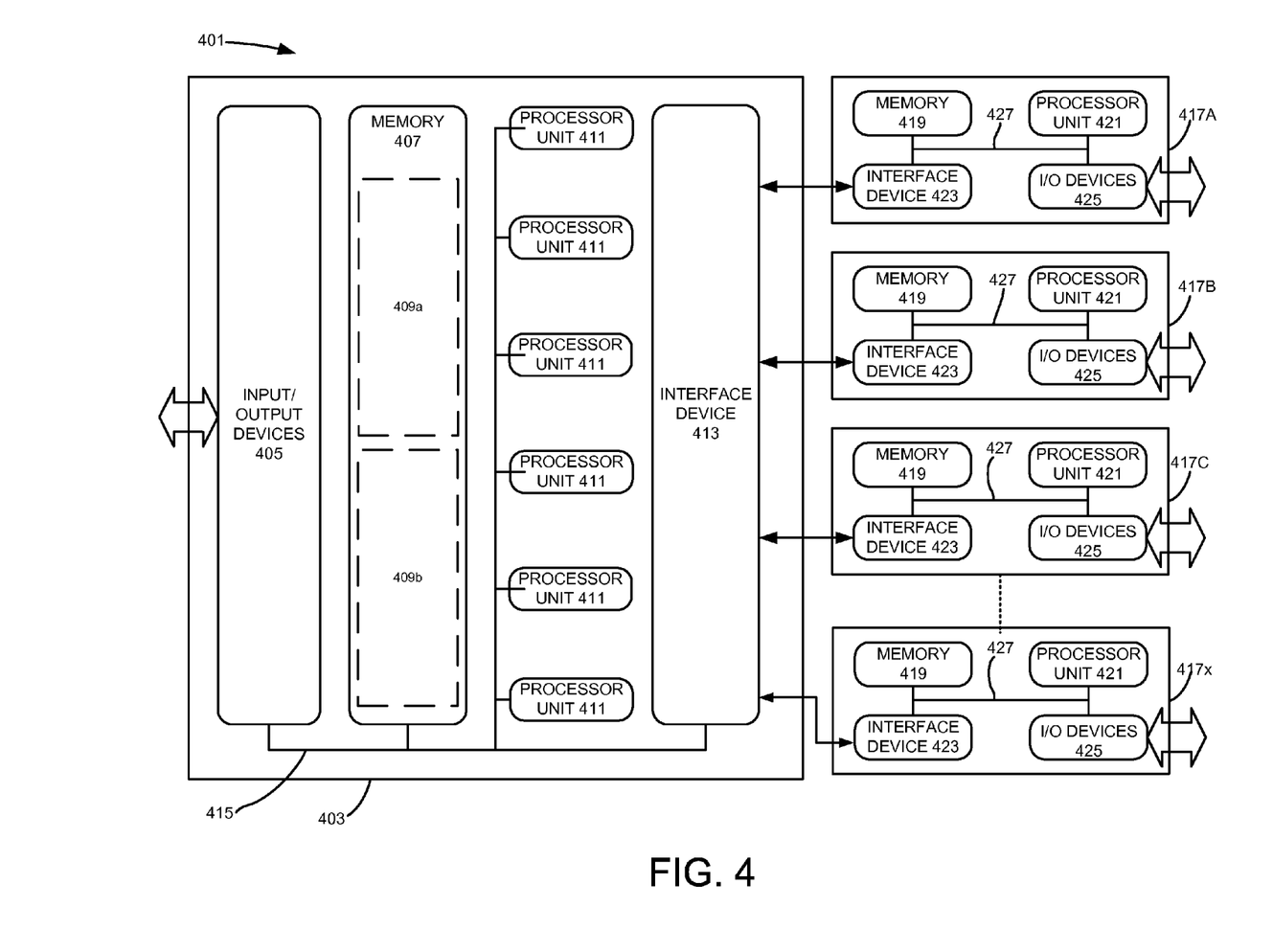
FIG. 4 shows an illustrative computing environment.

In FIG. 1, the computer network 401 includes a master computer 403. In the illustrated example, the master computer 403 is a multi-processor computer that includes a plurality of input and output devices 405 and a memory 407. The input and output devices 405 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 407 may similarly be implemented using any combination of computer readable media that can be accessed by the master computer 403. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 403 runs a software application for performing one or more operations according to various examples of the invention. Accordingly, the memory 407 stores software instructions 409A that, when executed, will implement a software application for performing one or more operations. The memory 407 also stores data 409B to be used with the software application. In the illustrated embodiment, the data 409B contains process data that the software application uses to perform the operations, at least some of which may be parallel.

The master computer 403 also includes a plurality of processor units 411 and an interface device 413. The processor units 411 may be any type of processor device that can be programmed to execute the software instructions 409A, but will conventionally be a microprocessor device. For example, one or more of the processor units 411 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 411 may be a custom manufactured processor, such as a microprocessor designed to optimally perform specific types of mathematical operations. The interface device 413, the processor units 411, the memory 407 and the input/output devices 405 are connected together by a bus 415.

Figure 5:
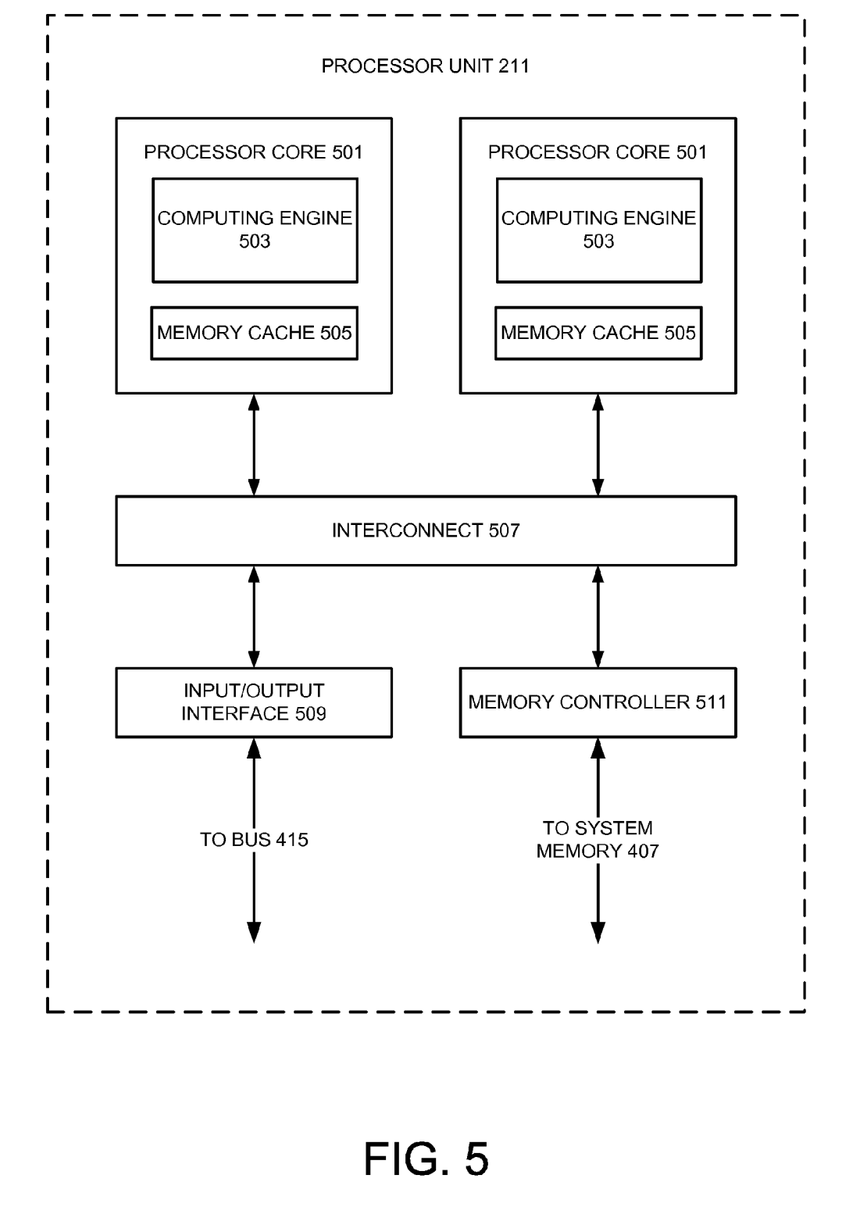
FIG. 5 shows a portion of the illustrative computing environment of FIG. 5, shown in further detail.

With some implementations of the invention, the master computing device 403 may employ one or more processing units 411 having more than one processor core. Accordingly, FIG. 5 illustrates an example of a multi-core processor unit 411 that may be employed with various embodiments of the invention. As seen in this figure, the processor unit 411 includes a plurality of processor cores 501. Each processor core 501 includes a computing engine 503 and a memory cache 505. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 503 may then use its corresponding memory cache 505 to quickly store and retrieve data and/or instructions for execution.

Each processor core 501 is connected to an interconnect 507. The particular construction of the interconnect 507 may vary depending upon the architecture of the processor unit 501. With some processor cores 501, such as the Cell Broadband Engine™ (Cell) microprocessor created by Sony Corporation, Toshiba Corporation and IBM Corporation, the interconnect 507 may be implemented as an interconnect bus. With other processor cores 501, however, such as the Opteron™ and Athlon™ dual-core processors available from Advanced Micro Devices of Sunnyvale, Calif., the interconnect 507 may be implemented as a system request interface device. In any case, the processor cores 501 communicate through the interconnect 507 with an input/output interfaces 509 and a memory controller 511. The input/output interface 509 provides a communication interface between the processor unit 411 and the bus 415. Similarly, the memory controller 511 controls the exchange of information between the processor unit 411 and the system memory 407. With some implementations of the invention, the processor units 411 may include additional components, such as a high-level cache memory accessible shared by the processor cores 501.

While FIG. 5 shows one illustration of a processor unit 411 that may be employed by some embodiments of the invention, it should be appreciated that this illustration is representative only, and is not intended to be limiting. For example, some embodiments of the invention may employ a master computer 403 with one or more Cell processors. The Cell processor employs multiple input/output interfaces 509 and multiple memory controllers 511. Also, the Cell processor has nine different processor cores 501 of different types. More particularly, it has six or more synergistic processor elements (SPEs) and a power processor element (PPE). Each synergistic processor element has a vector-type computing engine 403 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 411 can be used in lieu of multiple, separate processor units 411. For example, rather than employing six separate processor units 411, an alternate implementation of the invention may employ a single processor unit 411 having six cores, two multi-core processor units 411 each having three cores, a multi-core processor unit 411 with four cores together with two separate single-core processor units 411, or other desired configuration.

Returning now to FIG. 4, the interface device 413 allows the master computer 403 to communicate with the slave computers 417A, 417B, 417C . . . 417x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 413 translates data and control signals from the master computer 403 and each of the slave computers 417 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 417 may include a memory 419, a processor unit 421, an interface device 423, and, optionally, one more input/output devices 425 connected together by a system bus 427. As with the master computer 403, the optional input/output devices 425 for the slave computers 417 may include any conventional input or output devices, such as keyboards, pointing devices, microphones, display monitors, speakers, and printers. Similarly, the processor units 421 may be any type of conventional or custom-manufactured programmable processor device. For example, one or more of the processor units 421 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 421 may be custom manufactured processors, such as microprocessors designed to optimally perform specific types of mathematical operations. Still further, one or more of the processor units 421 may have more than one core, as described with reference to FIG. 5 above. For example, with some implementations of the invention, one or more of the processor units 421 may be a Cell processor. The memory 419 then may be implemented using any combination of the computer readable media discussed above. Like the interface device 413, the interface devices 423 allow the slave computers 417 to communicate with the master computer 403 over the communication interface.

In the illustrated example, the master computer 403 is a multi-processor unit computer with multiple processor units 411, while each slave computer 417 has a single processor unit 421. It should be noted, however, that alternate implementations of the invention may employ a master computer having single processor unit 411. Further, one or more of the slave computers 417 may have multiple processor units 421, depending upon their intended use, as previously discussed. Also, while only a single interface device 413 or 423 is illustrated for both the master computer 403 and the slave computers 417, it should be noted that, with alternate embodiments of the invention, either the master computer 403, one or more of the slave computers 417, or some combination of both may use two or more different interface devices 413 or 423 for communicating over multiple communication interfaces.

With various examples of the invention, the master computer 403 may be connected to one or more external data storage devices. These external data storage devices may be implemented using any combination of computer readable media that can be accessed by the master computer 403. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the slave computers 417 may alternately or additions be connected to one or more external data storage devices. Typically, these external data storage devices will include data storage devices that also are connected to the master computer 403, but they also may be different from any data storage devices accessible by the master computer 403.

It also should be appreciated that the description of the computer network illustrated in FIG. 4 and FIG. 5 is provided as an example only and is not intended to suggest any limitation as to the scope of use or functionality of alternate embodiments of the invention.

Introduction to Source Mask Optimization

As stated above, various implementations of the invention may be employed to determine an optimum source illumination profile and an optimum mask. As used herein optimum means the choice having the outcome satisfying a set of optimization conditions. For example, the optimum mask may be the mask resulting in the minimum amount of distortion in the printed image compared to a target image. Those of skill in the art will appreciate that optimum may be determined by numerical techniques that take into account representations of the lithographic process. Representations is often used herein to denote the description of physical features, phenomenon, or aspects by mathematical functions.

Figure 6:
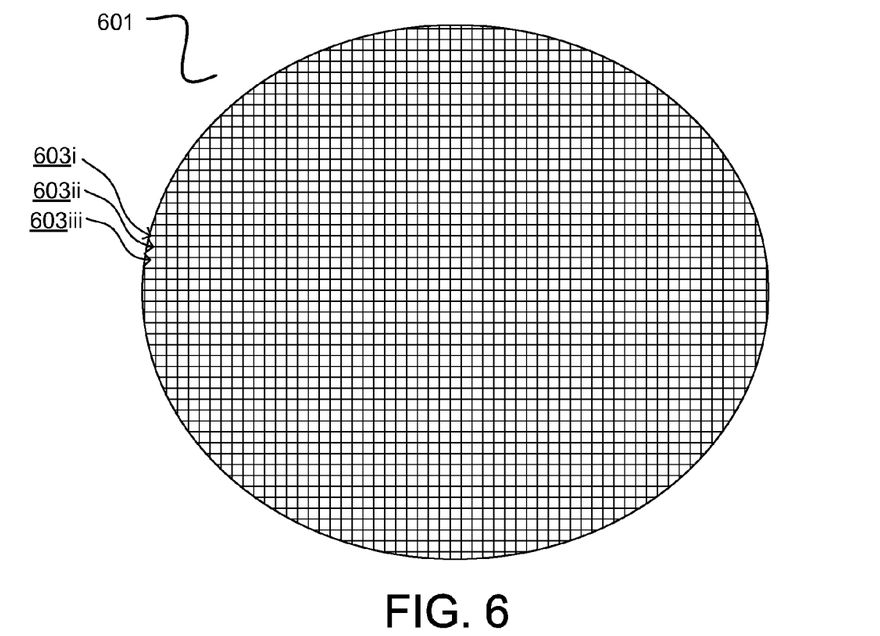
FIG. 6 shows a pixilated source illumination profile.
Figure 7:
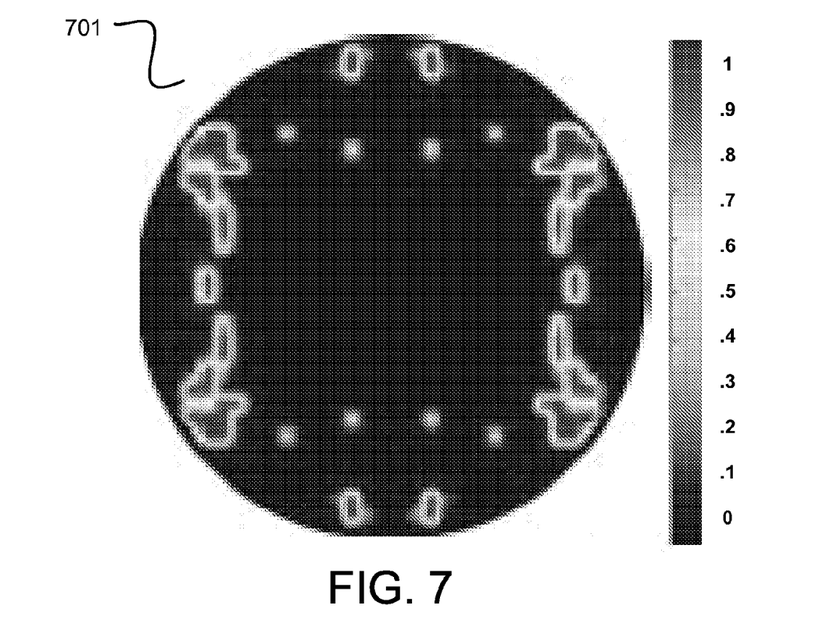
FIG. 7 shows a pixilated source illuminator profile.

FIG. 6 illustrates a source illuminator profile 601. As can be seen from this figure, the source illuminator profile 601 is divided into pixels 603. Each of the pixels 603 may have a corresponding brightness value 605 associated with it. For example, FIG. 7 illustrates a complex pixilated source 701 having a brightness value depicted for the pixels of the source illuminator profile. Various implementations of the invention may be employed to determine an optimum source illuminator profile. More particularly, various implementations may be employed to determine an optimum brightness value for the pixels within a source illuminator profile.

A mask design may also be pixilated as the source illuminator profile 601 is. Accordingly, for each pixel of the mask design a corresponding transmission value may be determined. For example, for the mask 301, the areas 303 would have a higher transmission value than for the areas 305. A mask design where the transmission values vary between 100% and 0% is often referred to as a continuous tone mask. As those of skill in the art can appreciate, a continuous tone mask typically undergoes further processing before it may be manufactured by a mask writing tool and subsequently employed in a photolithographic process. For example, a continuous tone mask may be converted into a binary mask (i.e. each pixel having either 100% or 0% transmission) prior to manufacturing. As used herein, mask may refer to a continuous tone mask or a manufacturable mask depending upon the context. Additionally, various terms used herein, such as the terms mask, layout, and source may be used to refer to the representations of these items. For example, the term mask may refer to the design for a mask stored digitally on a memory storage device.

Source Mask Optimization

Figure 8:
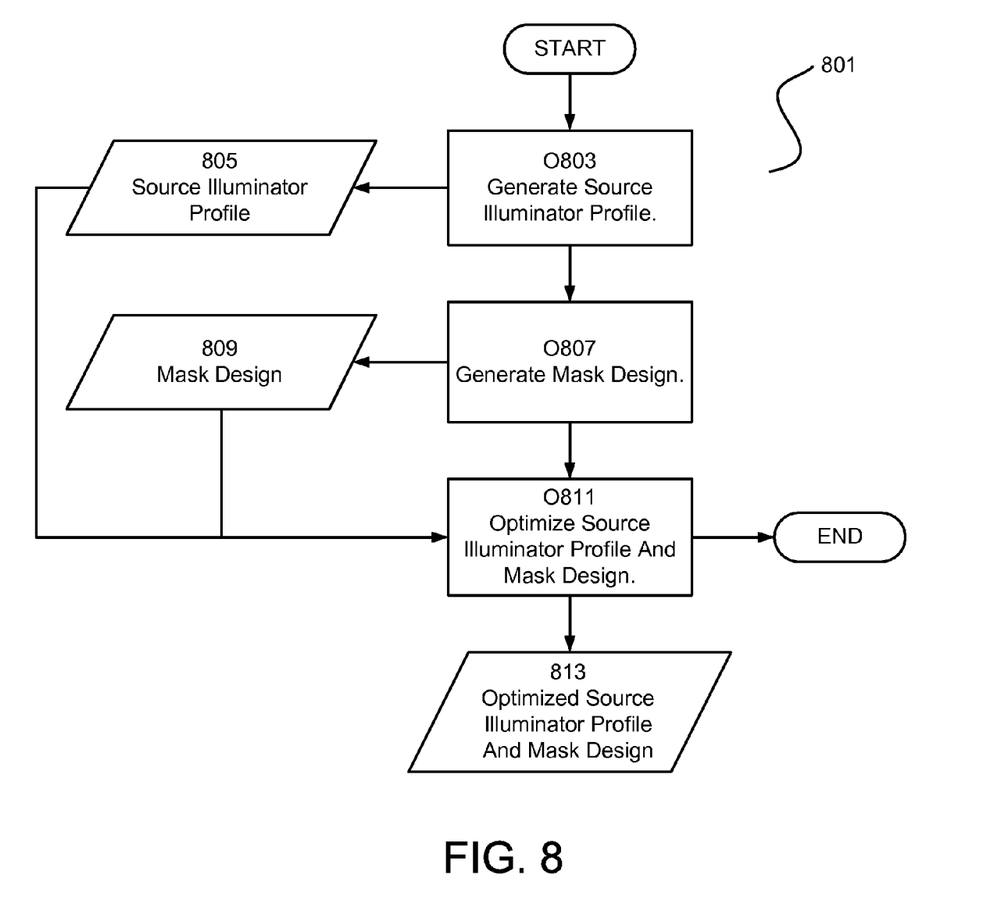
FIG. 8 illustrates a method of optimizing a source and mask according to various implementations of the present invention.

FIG. 8 illustrates a method of performing source mask optimization that may be provided according to various implementations of the present invention. As can be seen from this figure, the method 801 includes an operation 803 for generating a source illuminator profile 805, and operation 807 for generating a mask design 809, and an operation 811 for optimizing the source illuminator profile 805 and the mask design 809, resulting in an optimized source illuminator profile and mask design 813. Various implementations of the present invention will be described by reference to FIG. 8, FIG. 9, FIG. 10, FIG. 11, FIG. 12, FIG. 13, and FIG. 14 below.

Source Illuminator Generation

Figure 9:
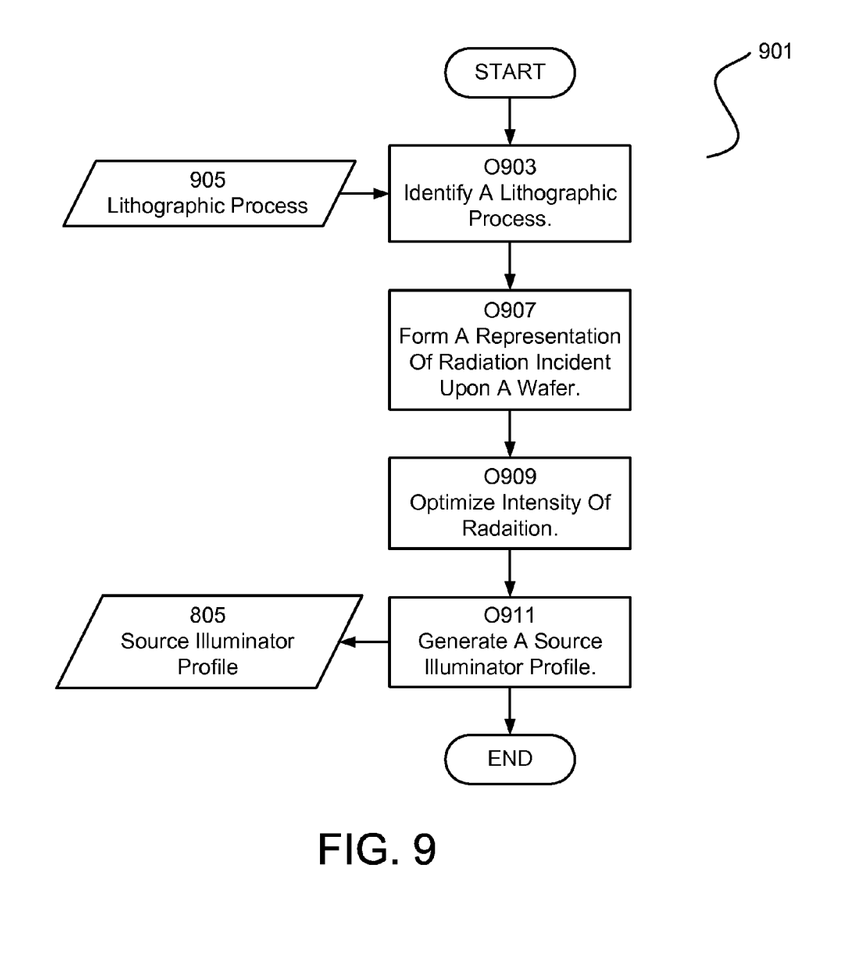
FIG. 9 illustrates a method of generating a source illuminator profile according to various implementations of the present invention.

FIG. 9 illustrates a method 901 that may be employed in various implementations of the present invention to perform the operation 803 and generate the source illuminator profile 805. As can be seen from this figure, the method 901 includes an operation 903 for identifying a lithographic process 905. In various implementations of the present invention, the operation 903 identifies a representation of the lithographic process. For example, the representation may have a model that describes the behavior of the lithographic process and details the various constraints of the process, such as for example the numerical aperture (NA) and the process node (i.e. 32 nm).

The method 901 further includes an operation 907 for forming a representation of radiation incident upon a wafer during the lithographic process 905 and an operation 909 for optimizing the intensity of radiation incident upon the wafer.

In various implementations of the invention, Equation (1) may be used to represent the radiation incident upon the wafer.

$$x^T A^i x = \text{Radiation Intensity} \quad (1)$$

Where $A^i$ is a matrix of intensity of radiation incident upon a wafer in quadratic form and x represents a column vector of diffraction orders of the radiation. With various implementations of the invention, $A_j^i$ may be used to represent the intensity of radiation incident upon points $P_j$ of a wafer due to a source illuminator profile. In various implementations, the source illuminator profile is formed from a series of coherent point sources $s_i$, i=1, 2, ..., m and its mirror image. In various implementations of the present invention, the representation of intensity is provided to the method 901, for example by a user of the method 901. Accordingly, the operation 907 may access or identify the representation.

In various implementations of the present invention, the operation 909 solves the Lagrangain dual problem for each point source $s_i$. More particularly, the operation 909 may derive the minimum of the diffractions orders (i.e. $x=[t_1+t_2+ \ldots +t_n]$), subject to the constraint that $B(i):=A^i-t_1A_1^i-t_2A_2^i- \ldots -t_nA_n^i$ is a positive semidefinite and $t_i \leq 0$. Herein the solution to the Lagranagin dual problem is denoted by m(i).

Figure 10:
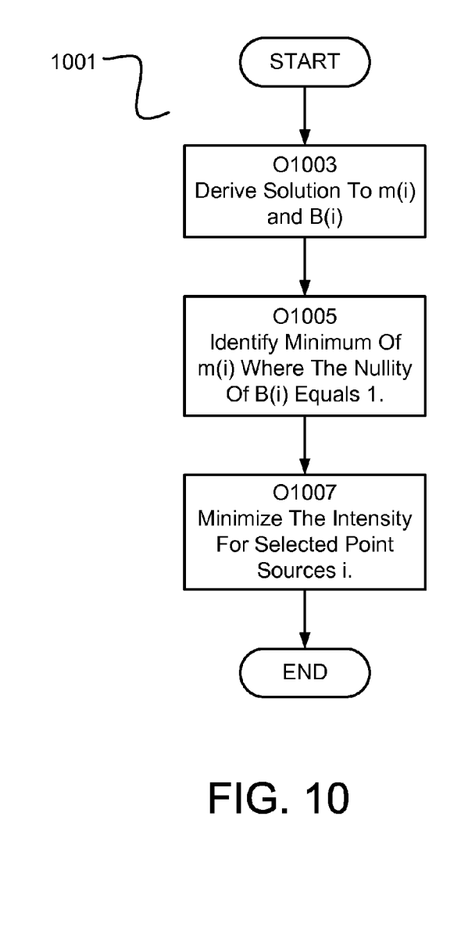
FIG. 10 illustrates a method of optimizing the intensity of radiation incident upon a wafer according to various implementations of the present invention.

FIG. 10 illustrates a method 1001 that may be provided by various implementations of the present invention to perform the operation 909. As can be seen from this figure, the method 1001 includes an operation 1003 for deriving the solution to m(i) and deriving the nullity of B(i) for each i; an operation 1005 for identifying the smallest occurrence of m(i) for which the nullity of B(i) equals 1; and an operation 1007 for minimizing the intensity of radiation incident upon selected points of the wafer.

In various implementations of the invention, the operation 1007 optimizes intensity by minimizing $x^T A_j^i x$ such that $x^T A_j^i x \leq c$ for the point sources $s_i$ corresponding to where m(i) is less than the instance of m(i) identified by the operation 1005. Herein the solution to this minimization problem is denoted by M(i). Where $x^T A_b^i x$ equals the intensity at points $P_b$, b=1, 2, ..., n representing "bright" regions on the wafer. As used herein bright regions are regions on the wafer where it is intended that radiation fall incident upon. For example, the bright regions may indicate areas inside features of an intended layout design. Additionally, c represents a constant, which in various implementations of the invention may equal 1. As a result of the operation 1007, a point source $s_i$ is identified for each point $P_j$. The method 901 also includes an operation 911 for generating the source illuminator profile 805. In various implementations of the invention, the source illuminator profile 805 is generated by letting the brightness value for each pixel corresponding to the point $P_j$ equal the derived minimized radiation intensity M(i) respectively. More particularly, the source illumination profile may equal the minimized set of point sources $s_i$.

Mask Generation

Figure 11:
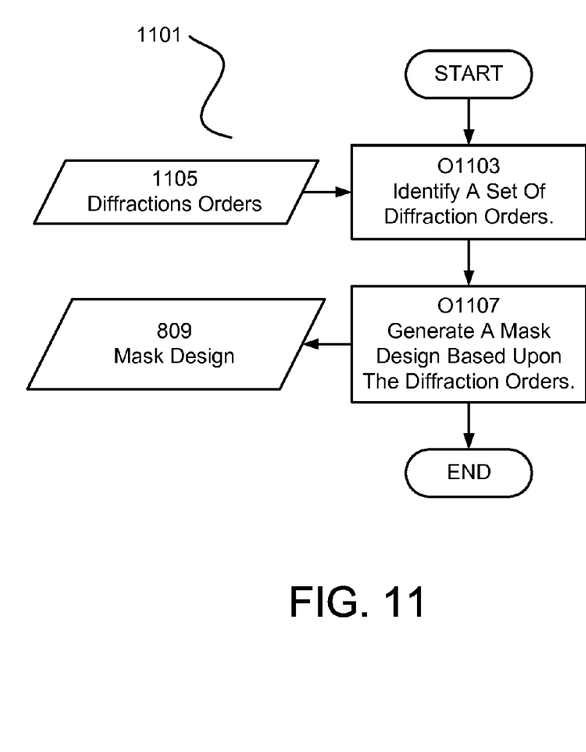
FIG. 11 illustrates a method of generating a mask design according to various implementations of the present invention.

FIG. 11 illustrates a method 1101 that may be employed in various implementations of the present invention to perform the operation 807 and generate the mask design 809. As can be seen from this figure, the method 1101 includes an operation 1103 for identifying a set of diffraction orders 1105 and an operation 1107 for generating the mask design 809 based upon the set of diffraction orders. In various implementations of the present invention, the set of diffraction orders 1105 are the diffraction orders $x=[t_1+t_2+ \ldots +t_n]$ corresponding to derived minimized radiation intensity M(i) for each point $P_j$ respectively. More particularly, the transmission value for each pixel of the mask design 805 may be determined based upon the diffraction orders of the minimized radiation intensity M(i) at the point $P_j$ corresponding to the mask design pixel. Those of skill in the art are capable of deriving mask transmission values based upon a set of diffraction orders (see e.g. U.S. Pat. No. 6,871,337 issued Mar. 22, 2005 to Robert Socha).

Source and Mask Co-Optimization

Figure 12:
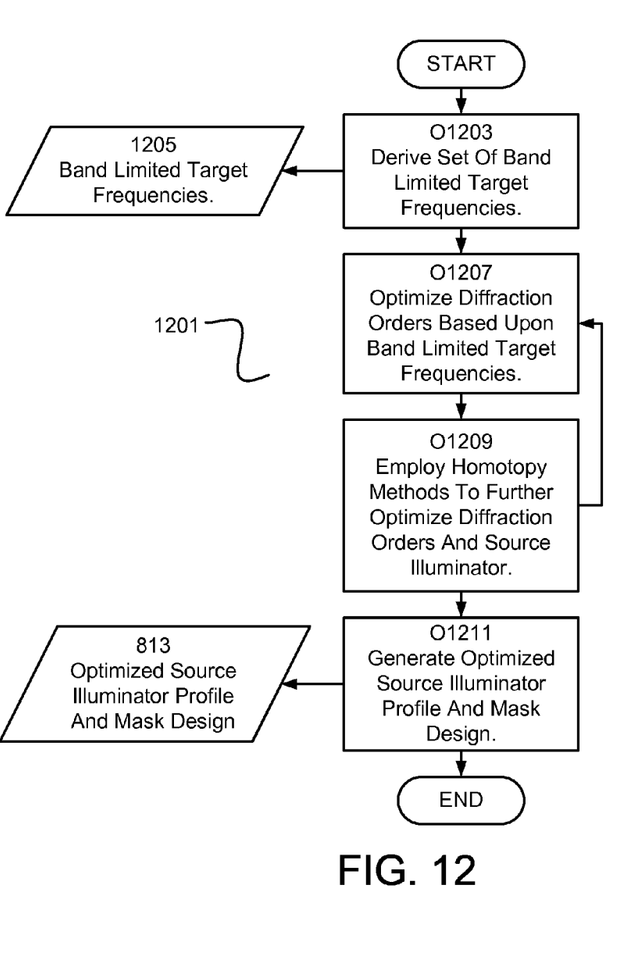
FIG. 12 illustrates a method of optimizing a source illuminator profile and a mask design according to various implementations of the present invention.

FIG. 12 illustrates a method 1201 that may be employed in various implementations of the present invention to perform the operation 811 and generate the optimized source illumination profile and mask design 813. As can be seen from this figure, the method 1201 includes an operation 1203 for deriving a set of band limited target frequencies 1205, an operation 1207 for optimizing the set of diffractions orders 1105 based upon the set of band limited target frequencies 1205, an operation 1209 for implementing homotopy methods to generate a set of optimum diffraction orders and an optimum source illuminator profile, and an operation 1211 for generating the optimized source illuminator profile and mask design 813.

In various implementations of the present invention, the operation 1203 derives the set of band limited target frequencies 1205 by optimizing a representation of the intensity of radiation incident upon a wafer as a function of the radiations frequencies. Equation (2) shows intensity represented as a function of its frequency. Particularly, I represents the value of the 2D Fourier transform of F at point a.

$$I(F,a) = \hat{f}(F,a) \tag{2}$$

Given a set of points $[P_1, P_2, \ldots, P_n]$ located in bright regions on the wafer, a set of points $[Q_1, Q_2, \ldots, Q_m]$ located in dark regions on the wafer, and an upper and a lower threshold $T_u$ and $T_l$, error functions may be defined as shows by Equation (3) and Equation (4) below.

$$err(F, P) = \begin{bmatrix} 0 \text{ if } T_u < I(F, P) < 1 \\ (T_u - I(F, P))^2 \text{ else} \end{bmatrix} \tag{3}$$

$$err(F, Q) = \begin{bmatrix} 0 \text{ if } 0 < I(F, Q) < T_l \\ (I(F, Q) - T_l)^2 \text{ else} \end{bmatrix} \tag{4}$$

As indicated above, dark regions on a wafer mean areas on the wafer where it is intended that radiation not fall. Conversely, bright regions on a wafer mean areas on the wafer where it is intended that radiation illuminate. In various implementations of the invention, the set of points P and Q may be determined based upon a rectangular grid. Alternatively, the points P and Q may be determined based upon a sample layout design. Given the above definitions and weight vectors $[w_1, w_2, \ldots w_n]$ and $[z_1, z_2, \ldots, z_m]$, a complete error function for the intensity may be defined as show by Equation (5) below. With respect to the weight vectors, the weights may all have the same value, such as for example 1, or the weights corresponding to points near edges of features or boundaries between bright and dark regions may have higher weight values than other points. The effect of this is to enhance image fidelity and the transition locations.

$$err(F) = w_1 err(F,P_1) + w_2 err(F,P_2) + \ldots + w_n err(F,P_n) + z_1 err(F,Q_1) + z_2 err(F,Q_2) + \ldots + z_m err(F,Q_m) \tag{5}$$

As illustrated by Equation (5), the error function is the sum of quadratic penalty functions. In alternative implementations, the error functions may be formulated as a linear programming problem, such as for example by implementing the error function with logarithmic barrier functions. The operation 1203 may optimize the representation of intensity by minimizing Equation (5) resulting in a minF and subsequently derive the inverse Fourier transform of minF, resulting in the set of band limited target frequencies 1205.

The operation 1207 optimizes the diffraction orders based upon the set of band limited target frequencies 1205. As stated above, the diffraction orders may be utilized to derive a continuous tone mask. Accordingly, optimizing the diffraction orders will enable optimization of the mask design 809. Let the intensity of radiation at point a be represented as a function of the diffraction orders O, the source illuminator profile Illum, and a defocus value d. Accordingly, the intensity of the radiation at point a may be defined by the following function.

$$I(O,Illum,d,a) \tag{6}$$

Given a set of defocus values $[d_1, d_2, \ldots, d_y]$ and a set of weights $[u_1, u_2, \ldots u_y]$, an error function for the representation of intensity defined by Function (6) may be given by the following Equation.

$$err(F,Illum) = u_1 err(F,Illum,d_1) + u_2 err(F,Illum,d_2) + \ldots + u_y err(F,Illum,d_y) \tag{7}$$

Where the individual error functions may be given as defined above by Equation (3) and Equation (4) for various bright and dark points. In various implementations of the invention, the squared terms are replaced by a p'th power, such as for example 16, while the error function would be replaced by the p'th root. The weights may also be selected as described above. As can be seen from FIG. 12, the operation 1207 may be repeated again after the operation 1209. With various implementations of the invention, the weights may all have the same value during the initial iteration of the operation 1207 and different values (i.e. higher values near edges as described above) during the subsequent iteration of the operation 1207.

Figure 13:
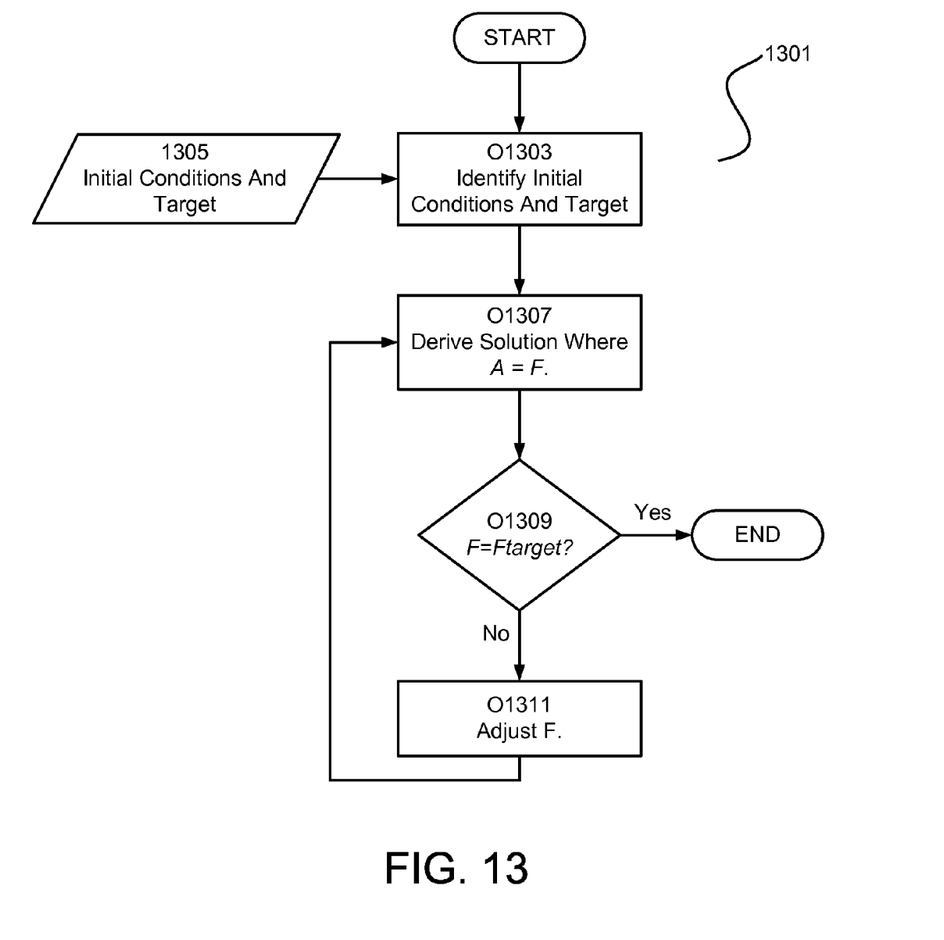
FIG. 13 illustrates a method of performing homotopy method to optimize a source illuminator profile and a mask design according to various implementations of the present invention.

FIG. 13 illustrates a method 1301 that may be employed in various implementations of the present invention to perform the operation 1209. The following definitions will be helpful when discussing FIG. 13. Some variables previously defined may be redefined here. Where there is a conflict between a prior definition and the following, the following shall control for purposes of discussing FIG. 13. Let O denote the set of diffraction orders; Illum denote the source illuminator profile; F denote a set of intensity frequencies; $F_{target}$ denote the set of target intensity frequencies; $O_{init}$ and $Illum_{init}$ denote the inputs to the operations 1209; and $I_{init}$ and $F_{init}$ denote the solution to the above defined functions based on $O_{init}$ and $Illum_{init}$. Additionally, let A denote a function that maps diffraction orders and a source illuminator profile to intensity frequencies (i.e. defining A(O,Illum)=F).

As can be seen from this figure, the method 1301 includes an operation 1303 for identifying a set of initial conditions 1305. In various implementations of the invention, the set of initial conditions includes $O_{init}$, $Illum_{init}$, $I_{init}$, and $F_{init}$. The method 1301 additionally includes an operation 1307 for deriving a solution to the function $A(O_t,Illum)=F_t$ in terms of the prior solution, where $F_t \neq F_{init}$, an operations 1309 for continuing with the method 1301 if $F_t \neq F_{target}$, and an operation 1311 for adjusting $F_t$. In various implementations of the invention, $F_t = F_{target}$ during the first iteration of the method 1301, accordingly, the operations 1307 will only be performed a single time. With other implementations of the invention, F is adjusted (i.e. by the operation 1311) in small increments, such as for example, 1% closer to $F_{target}$ for each iteration of the method 1301. In various implementations the adjustments step is 10% or even 25%.

Figure 14A:
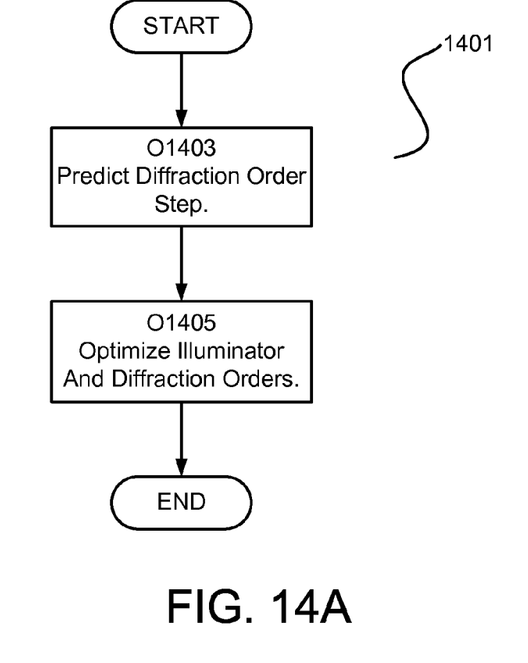
FIG. 14A illustrates the method of FIG. 13, in further detail.

FIG. 14A illustrates a method 1401 that may be employed in various implementations of the present invention to perform the operation 1307. As can be seen from this figure, the method 1401 includes an operation 1403 for predicting a diffraction order step. Particularly, the operation 1403 predicts a step dO such that O+dO=$O_t$ (i.e. A(dO+O,Illum)=$F_t$), where as stated previous the solution is in terms of the prior solution (i.e. $F_{prior}$). For example given $F_{init}$, the solution may be A(dO+$O_{init}$,Illum$_{init}$)=$F_t$. In various implementations, this is solved by linear approximation techniques. With various implementations, the solution is obtained by letting A($O_{init}$, Illum$_{init}$)+∂AdO=$F_t$, where ∂A equals the derivative of A. With some implementations, the solution is obtained by letting ∂AdO=$F_t$-$F_{prior}$. In further implementations, the solution is approximated using a least squares method, such as for example in the $L_1$ and $L_2$ norm. Additionally, constraints on the inverse Fourier transform of O may be added as detailed below.

Figure 14B:
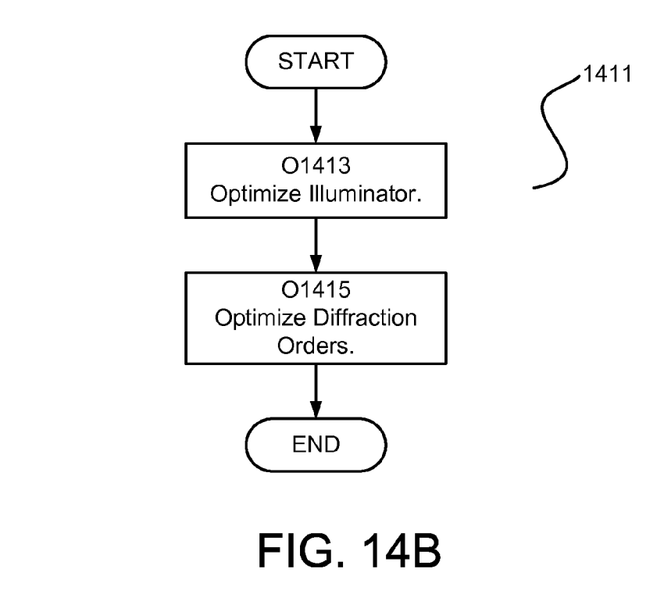
FIG. 14B illustrates the method of FIG. 14A, in further detail.

The method 1401 additionally includes an operation for optimizing the source illumination profile and the diffraction orders producing $O_{new}$ and Illum$_{new}$ such that the solution to A($O_{new}$,Illum$_{new}$) best matches $F_t$. In various implementations, the operation 1405 implements a nonlinear least squares optimization method to derive $O_{new}$ and Illum$_{new}$. With various implementations, the source illuminator profile and the diffraction orders are optimized separately, as illustrated in FIG. 14B. As can be seen from this figure, a method 1411 having operations 1413 and 1415 is disclosed.

In various implementations, the operation 1413 for optimizing the source illuminator profile may constrain the Illum to have $L_1$ norm 1 (i.e. the sum of all intensity values equals 1) and Illum is nonnegative. Subsequently the source illuminator profile that generates intensity frequencies as close as possible to Ft is identified. The identification may be accomplished by implementing a constrained least squares optimization in the $L_2$ norm and a linear programming optimization in the $L_1$ norm.

More particularly, holding O constant A may be written as a linear function of Illum alone. With respect to the $L_2$ norm, minimize $\|A(Illum)-F_t\|_2$ subject to the linear constraints that all 0<Illum<1 and ΣIllum=1. With respect to the $L_1$ norm, derive the minimum of Σti, such that $-t_i<(F_t)_i<t_i$, where i varies over the components of $F_t$, Illum is subject to the same constraints as above, and ti represents the diffraction orders as detailed above.

With various implementations, the operation 1415 for optimizing the diffraction orders, derives the minimum of $\|A(O)-F_t\|_2$ subject to the constraint that the inverse Fourier transform of O is bounded (i.e. Bound$_{Lower}$<Îf(O)<Bound$_{Upper}$). Letting b equal a constant, with various implementations of the invention, the upper bound may equal 1+b. With respect to the lower bound, for an attenuated phase shift mask, the lower bound may equal $-\sqrt{att}-b$, where att equals the attenuation of the phase shifted areas of the mask. For a binary mask, the lower bound may equal -b. For a continuous tone mask, the lower bound may equal -1-b.

Source Mask Optimization Apparatus

Figure 15:
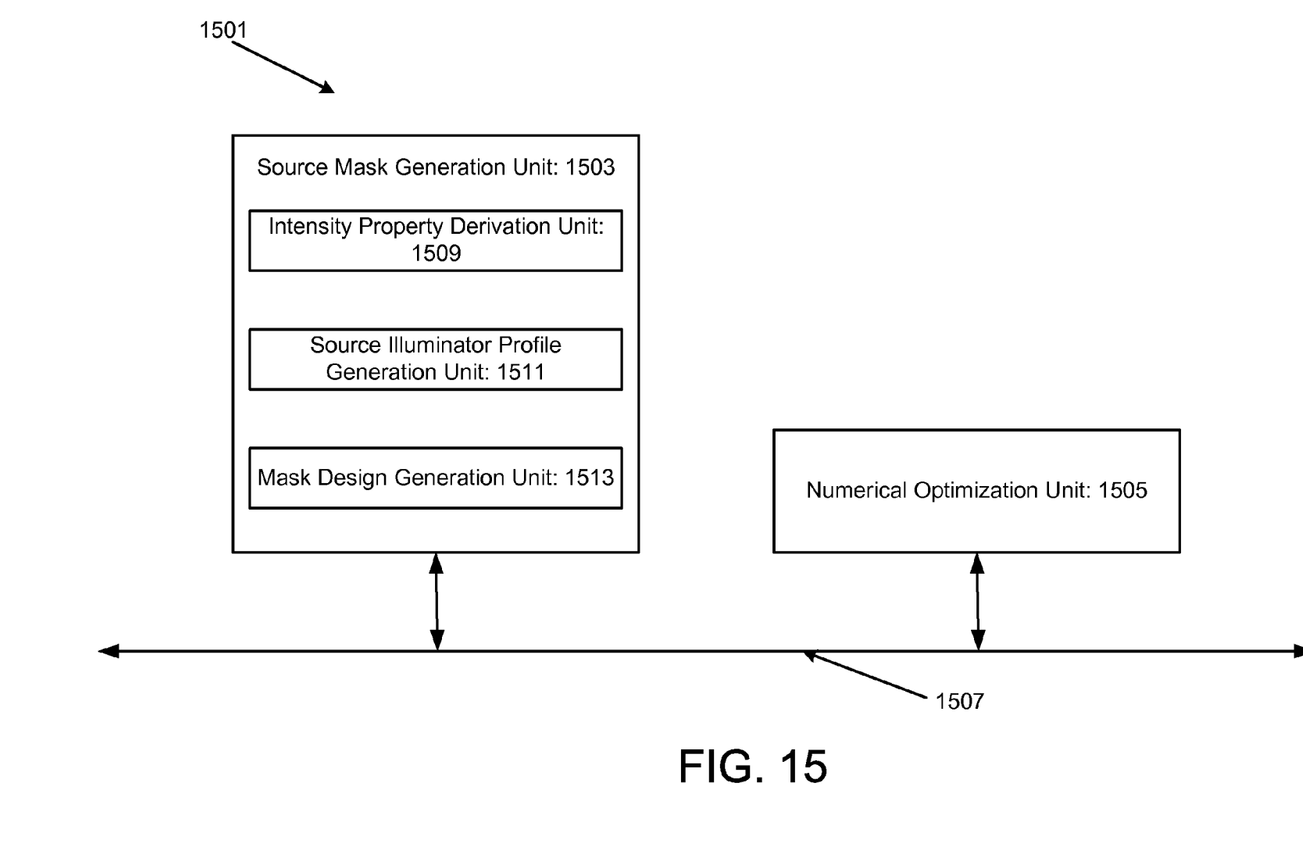
FIG. 15 illustrates a source mask optimization tool that may be provided according to various implementations of the present invention.

FIG. 15 illustrates a source mask optimization tool 1501 that may be provided according to various implementations of the present invention. As can be seen from this figure, the tool 1501 includes a source mask generation unit 1503 and a numerical optimization unit 1505. The source mask generation unit 1503 and the numerical optimization unit 1505 are connected by a bus 1507. The bus 1507 provides for the exchange of data between the unit 1503, the unit 1505, other electronic design automation tools, the host computing environment, and other computing devices or tools connected to the tool 1501. The source mask generation unit 1503 includes a radiation intensity derivation unit 1509, a source illuminator profile generation unit 1511, and a mask design generation unit 1513. In various implementations of the invention, the unit 1503 may be implemented to perform the operations 803 and 807 shown in FIG. 8. The unit 1505 includes necessary computation units (not shown) to perform optimization routines according to the techniques discussed above.

CONCLUSION

Various techniques for generating a source illumination profile and a continuous tone mask for utilization in an optical lithographic process have been discussed. In various implementations of the invention, a source illuminator profile is generated based upon an optimization of an optical lithographic radiation source. Various implementations may employ the Lagrange method for optimizing the radiation source, wherein an optimum intensity for each pixel of the source is determined. Subsequently, a continuous tone mask is generated based upon an optimization of intensity of radiation projected by the optical lithographic radiation source upon a wafer. In various implementations of the invention, the optimization derives optimum diffraction orders of the radiation, and based upon the optimized diffraction orders determines a transmission value for each pixel of the mask.

With various implementations of the invention, the source illuminator profile and continuous tone mask are optimized based upon a target intensity profile. In various implementations, the target intensity profile is generated by deriving a set of band limited target frequencies corresponding to the optical lithographic system. Subsequently, homotopy methods may be employed to optimize the source illuminator profile and the continuous tone mask based upon the set of band limited target frequencies.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A computer implemented method for performing source mask optimization comprising:
  forming a representation of an intensity of radiation at various points on a wafer;
  optimizing on a computer the representation of intensity of radiation;
  generating on the computer a source illuminator profile for use in a lithographic process based in part upon the optimization;
  generating on the computer a continuous tone mask based in part upon the optimization and the source illuminator profile;
  optimizing on the computer the source illuminator profile and the continuous tone mask; and
  saving the optimized source illuminator profile and the optimized continuous tone mask to a memory storage location.

2. A computer program product for performing source mask optimization comprising:
  one or more non-transitory computer readable medium bearing a set of software instruction that cause a computer to perform a set of operations, wherein the set of operations comprise:
  forming a representation of an intensity of radiation at various points on a wafer;

optimizing on the computer the representation of intensity of radiation;
generating on the computer a source illuminator profile for use in the lithographic process based in part upon the optimization;
generating on the computer a continuous tone mask based in part upon the optimization and the source illuminator profile;
optimizing on the computer the source illuminator profile and the continuous tone mask; and
saving the optimized source illuminator profile and the optimized continuous tone mask to a memory storage location.

3. A source illuminator profile and mask design generated by a method comprising:

forming a representation of an intensity of radiation at various points on a wafer;
optimizing on the computer the representation of intensity of radiation;
generating on the computer a source illuminator profile for use in the lithographic process based in part upon the optimization;
generating on the computer a continuous tone mask based in part upon the optimization and the source illuminator profile; and
optimizing on the computer the source illuminator profile and the continuous tone mask.

* * * * *